United States Patent [19]
Abe et al.

[11] Patent Number: 6,115,282
[45] Date of Patent: Sep. 5, 2000

[54] DYNAMIC MEMORY

[75] Inventors: Koichi Abe; Takashi Inui, both of Tokyo; Kohsuke Ikeda, Ryuugasaki; Toshiyuki Ishiuchi, Itako-machi, all of Japan

[73] Assignee: Texas Instruments Incorporated, Dallas, Tex.

[21] Appl. No.: 09/215,906

[22] Filed: Dec. 18, 1998

[30] Foreign Application Priority Data

Dec. 25, 1997 [JP] Japan ................................ 9-367178

[51] Int. Cl.⁷ .................................................. G11C 11/00
[52] U.S. Cl. ........................... 365/149; 365/193; 365/195
[58] Field of Search ................................. 365/169, 202, 365/203, 193, 195, 206

[56] References Cited

U.S. PATENT DOCUMENTS 6,003,096 12/1999 Lee ........................................ 365/193

*Primary Examiner*—A. Zarabian
*Attorney, Agent, or Firm*—Bret J. Petersen; Frederick J. Telecky, Jr.

[57] ABSTRACT

The objective is to provide a type of dynamic memory which does not adversely affect the data, even when noise is superimposed on the RAS signal.

8 Claims, 6 Drawing Sheets

DYNAMIC MEMORY

FIELD OF THE INVENTION

1. Industrial Application Field

This invention pertains to a type of dynamic memory. In particular, this invention pertains to a type of dynamic memory which can prevent damage to data in the memory cells even when a noise is superimposed on the RAS signal.

2. Background of the Invention

In the conventional dynamic memory, plural memory cells are formed. These memory cells form a memory cell array by means of matrix-configured WORD lines and BIT lines.

FIG. 9 illustrates memory cell array 110, BIT line equalizer 131 and sense amplifier 132.

Said memory cell array 110 has plural memory cells 130. Each memory cell has one MOS transistor as a switch and one capacitor for storing data.

In memory cell array 110, WORD lines and BIT lines are arranged in a matrix. Two BIT lines form a group. When memory cell 130 is selected by means of the selected WORD line, the capacitor in memory cell 130 is connected to any bit line in one group of BIT lines.

One BIT line equalizer 131 and one sense amplifier 132 are arranged in each BIT line group. Said BIT line equalizer 131 is connected to VBLR line and BLEQ line. Also, sense amplifier 132 is connected through switches 1331 and 1332, which are controlled by SAE line and $\overline{SAE}$ line, to the line of power source voltage VD and the ground line, respectively (SAE: Sense Amplifier Enable).

WORD line, BLEQ line, SAE line (and $\overline{SAE}$ line) are connected to memory cell array controller 102 in the prior art shown in FIG. 8 (or memory cell array controller 2 used in this invention to be explained below).

Memory cell array controller 102 has a configuration that enables the following operation: since RAS signal (RAS: Row Address Strobe) is input from the outside, depending on the state of the RAS signal, memory cell array controller 102 changes the states of BLEQ line, WORD line, and SAE line; when the RAS signal makes a transition from the reset state to the set state, the setting operation is carried out; when the RAS signal makes a transition from the set state to the reset state, the resetting operation is carried out.

The procedure of this operation control can be explained with reference to the timing diagram shown in FIG. 10.

In the timing diagram shown in FIG. 10, for the RAS signal, the low state indicates the set state, while the high state indicates the reset state.

Memory cell array controller 102 has the following circuits: RAS input circuit 111, filter 112, address decoder 113, equalizer controller 114, WORD line controller 115, S/A controller 116 (S/A: Sense Amplifier), WORD line reset circuit 118, S/A reset circuit 119, and clock reset circuit 120.

Among the signals input and output among the various circuits, the signal path for transmission in the case of transition of the RAS signal from the reset state to the set state is indicated by the solid arrows s1–s6 in FIG. 8. On the other hand, the signal path in the case of transition of the RAS signal from the set state to the reset state is indicated by the broken arrows r1–r6.

In the initial state, the RAS signal is in the reset state, the WORD line is low, the SAE line is low ($\overline{SAE}$ line is high), and the BLEQ line is high.

When the WORD line is low, the MOS transistor in memory cell 130 is turned off, and the capacitor in memory cell 130 is cut off from the BIT line. Also, when the SAE line is low, switches 1331 and 1332 are turned off, and power source voltage V0 and ground voltage are applied to sense amplifier 132.

On the other hand, when the BLEQ line is high, BIT line equalizer (131) is in the operating state, and two BIT lines (BIT line 1 and BIT line 2) are connected to the VBLR line, respectively. As a voltage half the power source voltage VD (VD/2) is applied to the VBLR line, the BIT line is precharged to the voltage VD/2.

When the RAS signal makes a transition from the reset state to the set state, and memory cell array controller 102 starts the setting operation, the state becomes inverted to that when the RAS signal is in the reset state for the BLEQ line, WORD line, and SAE line, in that order.

In this case, first, low-state signal s1 with the RAS signal amplified is output from RAS input circuit 111 to which the RAS signal is input to filter 112 (start of the period indicated by A).

LHL filter for removing the pulse-like high noise (LHL noise) contained in the low-state signal is contained in filter 112. Signal s2 is output from filter 112 through LHL filter to address decoder 113. Consequently, after the RAS signal makes a transition from the reset state to the set state (after transition from the high state to the low state), no LHL noise is contained in signal s2 output to address decoder circuit 113.

An address signal is input from a peripheral circuit beforehand into address decoder 113. In address decoder 113, upon input of signal s2, decoding of the address signal is started, and signal s3, which indicates the readiness of the address, is output to equalizer controller 114 and WORD line controller 115.

When signal s4 is output from equalizer controller 114 with signal s3 input to it, first, a change in the state of the BLEQ line starts, and the BLEQ line changes from high to low.

When the BLEQ line goes low, for BIT line equalizer 131, the operation stops, and two BIT lines are cut off from the VBLR line and become the floating state (end of period A).

Then, when signal s5 is output from WORD line controller 115, change in state of the WORD line selected by the address signal is started (start of the period indicated by B), the WORD line goes from low to high, and the capacitor in memory cell 130 connected to the WORD line is connected to one of the BIT lines in the BIT line group.

The capacitor is set to ground or is charged to power source voltage VD. However, since the capacitance is small, the BIT line connected to the capacitor is charged to a voltage a little lower or a little higher than the precharged voltage VD/2, and a minute voltage difference appears between the BIT lines in a BIT line group.

Signal s5, which is output from WORD line controller 115 and changes the state of the WORD line, is also input to S/A controller 116. After the WORD line goes high, S/A controller 116 to which signal s5 is input outputs signal s6, and changes the SAE line from low to high.

When the SAE line goes high (when the $\overline{SAE}$ line makes a transition from high to low), switches 1331 and 1332 conduct, and power source voltage VD and ground voltage are applied to sense amplifier 132, and sense amplifier 132 starts its operation.

When sense amplifier 132 operates, the minute voltage difference between the two BIT lines in a BIT line group is amplified. The BIT line having a slightly higher voltage is set to power source voltage VD, while the BIT line having a slightly lower voltage is set to the ground potential, and determination of the state of the BIT lines is completed (end of period B).

In this state, since the data stored in the memory cell appear on the BIT line, the data can be read by detecting the voltage of the BIT line.

Also, in this state, since the capacitor in the memory cell is connected to the BIT line, by applying a voltage indicating the desired data on the BIT line, the capacitor can be charged/discharged to the applied voltage so as to write the data (start of period C).

The RAS signal returns from the set state to the reset state after the start and before the end of the read or write operation. At the time of the end of the read or write operation, signal r1 indicating return to the reset state of the RAS signal has been output from RAS input circuit 111 to filter circuit 112.

However, due to the influence of the LHL filter contained in filter circuit 112, transmission of signal r1 to the later stage is delayed, and delayed signal r2 is output from filter circuit 112 to WORD line reset circuit 118, so that memory cell array controller 102 starts the reset operation.

Upon input of signal r2, WORD line reset circuit 118 outputs signal r3 to both WORD line controller 115 and S/A reset circuit 119. WORD line controller 115, which receives signal r3 as an input, outputs signal r4, releases the state change of the WORD line in the high state, resets it to the low state, and cuts off the capacitor in memory cell 130 from the BIT line.

Then, signal r6 is output from S/A controller 116, to which signal r3 has been input, and the state change of the SAE line changes from high and returns to low, so that switches 1331 and 1332 are turned off, and the operation of sense amplifier 132 stops.

When the operation of sense amplifier 132 stops, due to delay of signal r2, the read or write operation has been completed.

Signal r6 output from S/A controller 116 is also input to clock reset circuit 120. With the input of signal γ6, clock reset circuit 120 outputs signal r7 to address decoder 113 and equalizer controller 114.

With the input of signal r7, equalizer controller 114 outputs signal r8, and the state of the BLEQ line goes from low to high. As the BLEQ line goes high, the operation of BIT line equalizer 131 starts, the BIT line is connected to the VBLR line, and the BIT line is precharged to voltage VD/2.

On the other hand, address decoder 113, to which signal r7 has been input, detects the end of the reset operation, outputs the state to the external circuit, and resets memory cell array controller 102 to the initial state.

As explained above, when the RAS signal is a transition from the reset state to the set state, memory cell array controller 102 starts the setting operation, transmits the change in the RAS signal in the order of signals s4, s5, and s6, changes the states of the BLEQ line, WORD line, and SAE line in order, disconnects the BIT line from the VBLR line, connects the BIT line to the capacitor, and determines the state of the BIT line by means of sense amplifier 132.

In this case, in order to input/output the data at high speed, it is necessary to change the states of the BLEQ line, WORD line, and SAE line as fast as possible during the period from the transition of the RAS signal to the set state until the end of the determination of the state of the BIT line. In the dynamic memory, data input/output is performed in about 50 nsec from the time of transition of the RAS signal to the set state. Consequently, it is difficult to insert a filter for HLH noise that would delay the set operation in memory cell array controller 102.

On the other hand, when the RAS signal performs the reset operation, return of the RAS signal to the reset state is transmitted in the order of signals r5, r6, and r4, the state change of the WORD line, SEA [sic; SAE] line and BLEQ line is released in that order, the capacitor is cut off from the BIT line, the operation of sense amplifier 132 is stopped, and connection of the BIT line to the VBLR line is carried out.

In this case, in order to ensure a sufficient time margin for data input/output, in memory cell array controller 102, return of the RAS signal to the reset signal is delayed as it is transmitted, and the reset operation is started after a prescribed time delay. Consequently, when the HLH noise is superimposed on the RAS signal in the high state, memory cell array controller 102 finally amplifies the HLH noise and, due to the faulty operation, the data in memory cell array (110) may be adversely attracted. This is a disadvantage.

For example, as shown in FIG. 11(a), when low noise 141 (HLH noise) is superimposed on the RAS signal in the initial state, memory cell array controller 102 starts the setting operation, and the capacitor is connected to the BIT line.

When the RAS signal returns to the reset state immediately thereafter, by means of the reset operation that starts after a prescribed time delay, during the amplification of the voltage difference between the BIT lines by sense amplifier 132, the operation may be stopped. In this case, since the determination of the state of the bit line has not been completed, the capacitor is charged to an intermediate voltage, and it becomes impossible to hold the data in memory cell 130 normally (all low failure).

Also, as shown in FIG. 11(b), when low noise 142 (HLH noise) is superimposed on the RAS signal during the reset operation, the operation of BIT line equalizer 131 may start while the capacitor is connected to the BIT line. As the capacitor is charged to the intermediate voltage of the VBLR line, that is, VD/2, the data in memory cell 130 is erased (all low failure).

In order to solve the aforementioned problem, it has been proposed that interlock be made between the case when the input RAS signal is changed from the reset state to the set state and the case when it returns from the set state to the reset state. However, in this case, there is a danger that the interior is entirely enclosed, and the input from the exterior is not received at all.

SUMMARY OF THE INVENTION

A general object of this invention is to solve the aforementioned problems of the conventional technology by providing a type of dynamic memory in which the data are not affected even when noise is superimposed on the RAS signal.

According to a still further aspect of this invention, return of the RAS signal from the set state to the reset state is detected early, and, if the timing is before the driving of the word line, the driving is stopped and the entire system returns to the initial state, so that the capacitor in the memory cell can be maintained at the voltage before the start of the setting operation, and damage to the data can be prevented.

On the other hand, when the timing of return of the RAS signal to the reset state is after the connection of the capacitor to the bit line and before end of the state determination, as driving of the word line is released, the capacitor is cut off from the bit line before discrimination of polarity of the bit line pair, and the capacitor is charged to the intermediate voltage instead. In this case, the setting operation continues, and determination of the state of the bit line pair comes to an end, so that the capacitor is charged to the normal voltage.

Consequently, later when the reset operation is started and the capacitor is disconnected from the bit line and returns to the initial state, the data in the memory cell is still not adversely affected.

On the other hand, when the RAS signal makes a transition from the reset state to the set state after the reset operation is started and driving of the word line is released and before connection of the bit line pair to the VBLR line, the setting operation is started without delay. Consequently, before the end of the precharging of the bit line pair, the bit line pair is directly cut off from the VBLR line, and the capacitor is connected to the bit line in this state. Consequently, the capacitor is connected to the bit line at the intermediate voltage, so that it is impossible to determine the state correctly.

For the dynamic memory of yet another aspect of this invention, in this case, in the memory cell array controller, the signal of transition to the set state is ignored, the reset operation is continued, and, after the end of the precharging of the bit line pair, it returns to the initial state.

As explained above, for the dynamic memory of a further aspect of this invention with the aforementioned configuration, even when low noise (HLH noise) indicating the set state is superimposed on the RAS signal of the reset state, the data in the memory cell is still not damaged. On the other hand, it is also possible to set a filter for removing the high noise (LHL noise) indicating the reset state from the RAS signal of the set state.

REFERENCE NUMERALS AS SHOWN IN THE DRAWINGS

Figure 2:
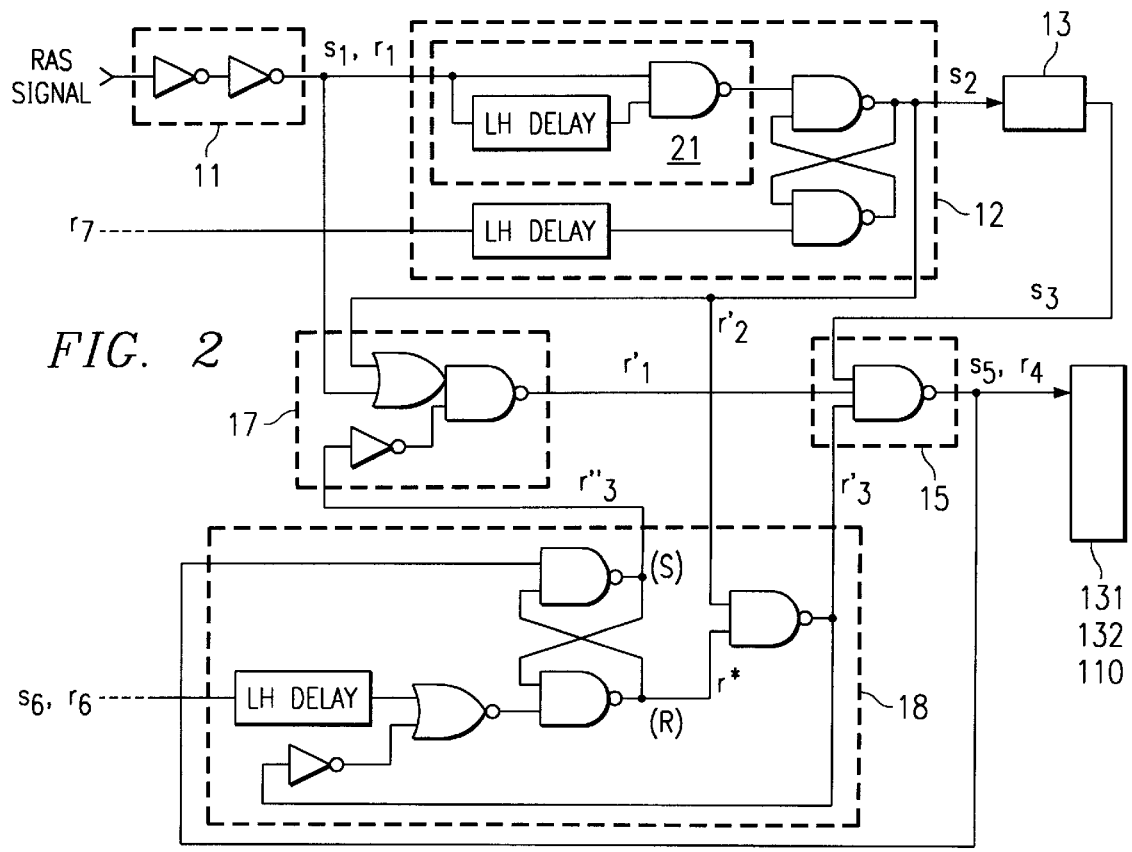
FIG. 2 is a partial detailed circuit diagram of the aforementioned memory cell array controller.

In the FIG. 2 represents a memory cell array controller, 130 a memory cell, 131 a BIT line equalizer, and 132 a sense amplifier.

Decription of the Embodiments

Figure 1:
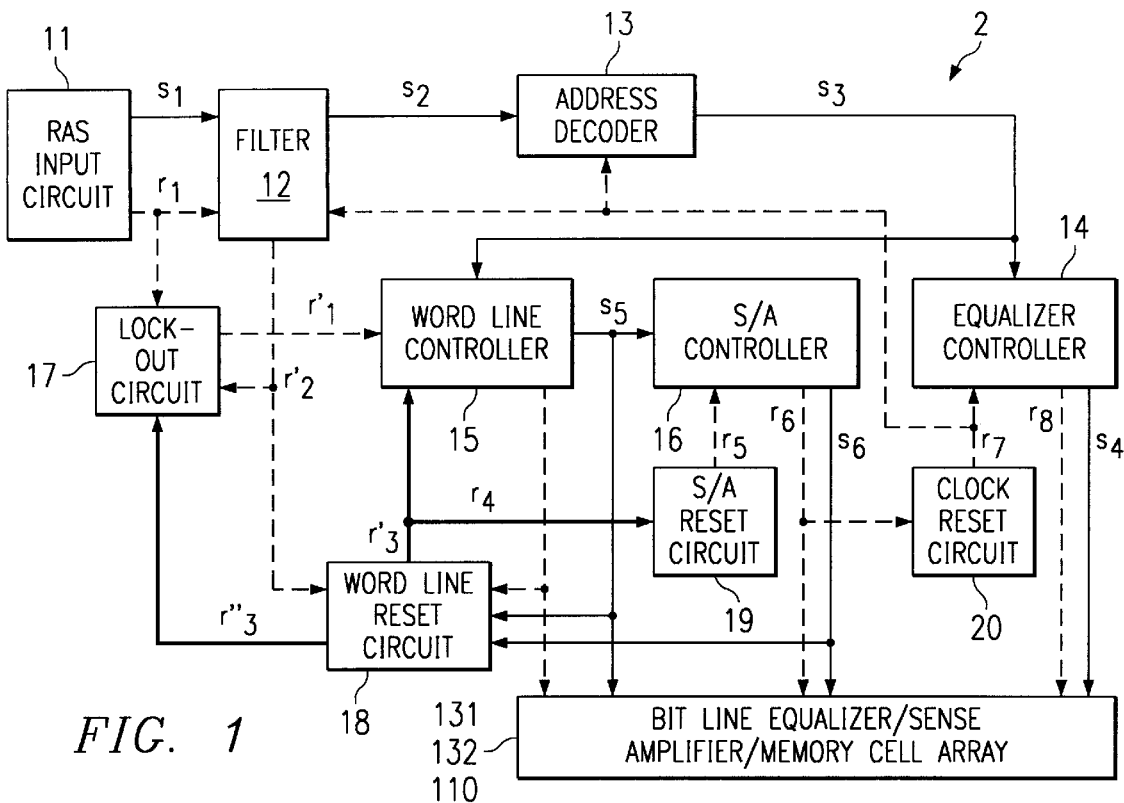
FIG. 1 is an internal block diagram illustrating the memory cell array controller of the dynamic memory of this invention.

In FIGS. 1, 2 represents a memory cell array controller set in the dynamic memory of this invention. It has the following parts: RAS input circuit 11, filter circuit 12, address decoder 13, equalizer controller 14, WORD line controller 15, S/A controller 16, lock-out circuit 17, WORD line reset circuit 18, S/A reset circuit 19, and clock reset circuit 20.

Like the dynamic memory having said memory cell array controller 102, in the initial state and in the reset operation of the dynamic memory having said memory cell controller 2, signal r4, which is high, is output from WORD line controller 15. In this case, the WORD line goes low, and the capacitor in memory cell 130 is not connected to the BIT line.

On the other hand, when the set operation is started and signal s5 in low state is output from WORD line controller 15, the selected WORD line changes to the high state, and the capacitor in memory cell 130 connected to the WORD line is connected to the BIT line.

Also, in memory cell array controller 2, in the setting operation, signal s5 output from WORD line controller 15 is also input to WORD line reset circuit 18. In addition, the signal is transmitted in the same order as said memory cell array controller 102, and the state of the BIT line is determined. Consequently, the operation until the RAS signal is input normally and the data input/output from the polarity discriminated BIT line is carried out is identical to that of said memory cell array controller 102. Consequently, the explanation of that operation is omitted.

On the other hand, the signal transmission route and operation when the RAS signal returns from the set state to the reset state are different.

<Reset Operation When Normal RAS Signal is Input>

First, the operation when the RAS signal indicating the reset state is input normally after start of the setting operation will be explained.

FIG. 2 is a detailed circuit diagram illustrating memory cell array controller 2. After the RAS signal input to RAS input circuit 11 becomes the set state and the state determination of the BIT line becomes normal, it returns to the reset state. First, high-state signal r1 is output from RAS input circuit 11 to filter (12) and lock-out circuit 17, and the reset operation in memory cell array controller 2 is started.

Figure 3:
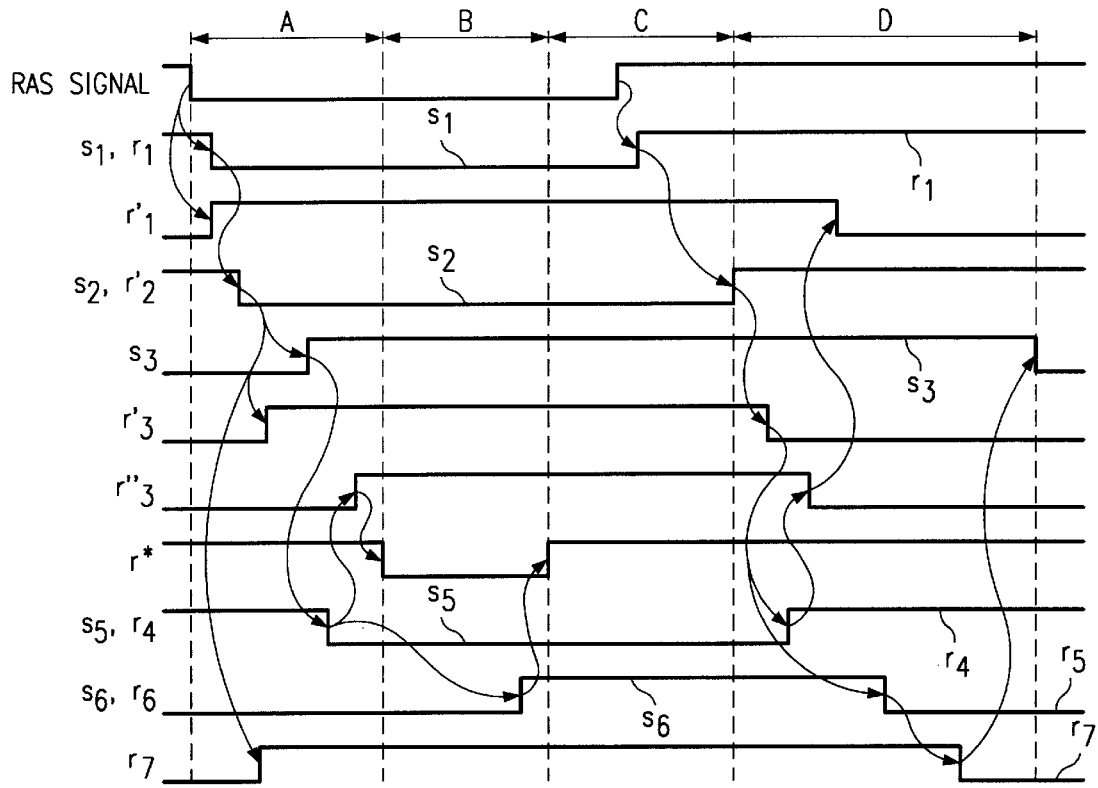
FIG. 3 is a timing diagram illustrating the operation when the RAS signal is normal.

This operation can be explained with reference to the timing diagram shown in FIG. 3.

LHL filter 21 made of LH delay circuit and NAND gate and flip-flop circuit made of two NAND gates are arranged in filter 12. In this flip-flop circuit, signal r1 output from RAS input circuit (11) is input in the inverted state through LHL filter 21. It is inverted again by flip-flop circuit, and becomes output r'2 of the filter. Said output r'2 is high, and it is also input to WORD line reset circuit 18, lock-out circuit 17, and address decoder 13.

In WORD line reset circuit (18), output r'2 is connected to the input terminal on one side of the NAND gate, and the input terminal on the other side of the NAND gate goes high by means of the flip-flop circuit in the previous stage when the setting operation is carried out.

The output of the NAND gate becomes output r'3 of WORD line reset circuit 18, and it is connected to one input terminal of WORD line controller 15 made of 3-input NAND gate. In this case, as output r'3 goes low, the output of 3-input NAND gate goes high regardless of the state of the other input terminals. When high-state signal r4 is output from the 3-input NAND gate, the logic state of the WORD line in the high state is released, so that it returns to the low state, and the capacitor of the memory cell is cut off from the BIT line.

Finally, when high-state signal s3 output from address decoder circuit 13 is not output, the reset operation comes to an end, and memory cell array controller 2 returns to the initial state.

<When the Reset State Returns in a Short Time After Reset of the RAS Signal>

The operation when the RAS signal returns to the reset state after start of the setting operation and before the change in the state of the selected WORD line (before connection of the memory cell to the BIT line: period A) will be explained.

Figure 4:
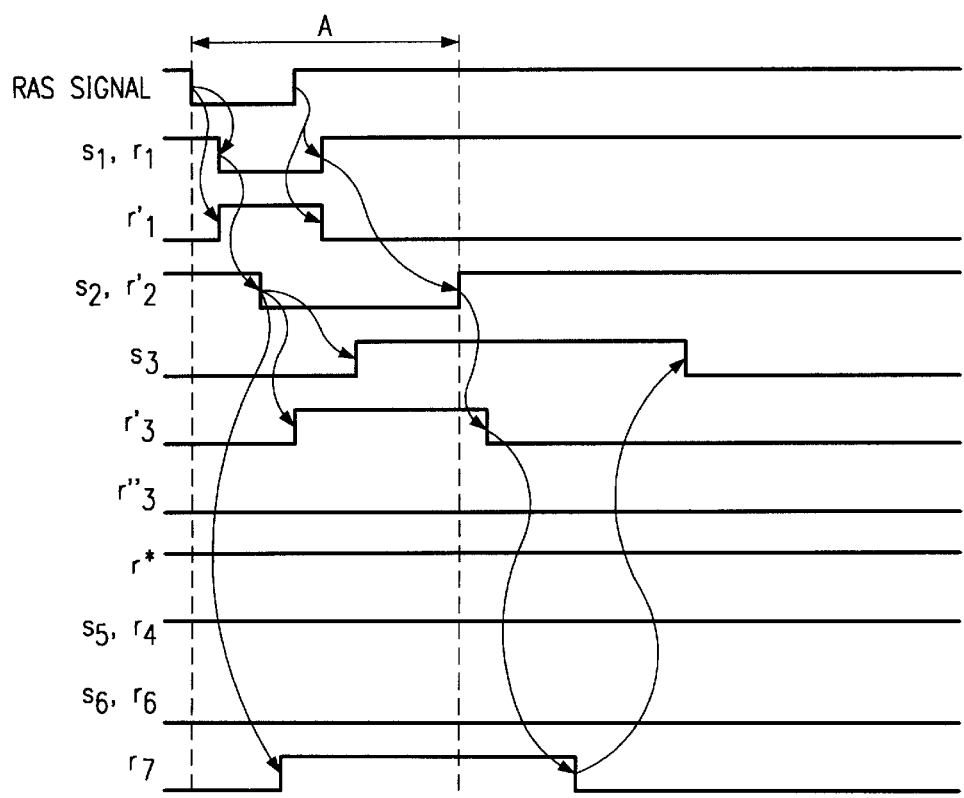
FIG. 4 is a timing diagram illustrating the case when the RAS signal in the set state returns to the reset state during period A.

As shown in the timing diagram in FIG. 4, when the RAS signal becomes the set state, low-state signal s2 is output from filter circuit 12 to address decoder 13.

Address decoder 13 with signal s2 input to it outputs high-state signal s3 to BIT line equalizer 14 and WORD line controller 15.

As signal s4 is output from equalizer controller 14 with signal s3 input to it, the BLEQ line goes low, and BIT line equalizer 131 in the operation state is stopped.

In lock-out circuit 17, output r"3 of WORD line reset circuit 18 is input through an inverter to the input terminal on one side of NAND gate in the output stage, and the output of the OR gate is input to the input terminal on the other side.

Signal r1 output from RAS input circuit 11 is directly input to the input terminal of the OR gate on one side, and output r'2 of filter circuit 12 is input to the input terminal on the other side.

For the case of transition of the RAS signal from the reset state to the set state, signal r1 output from RAS input circuit 11 goes low directly. Also, output r'2 of filter 12 is delayed and goes low (signal s2). As a result, low-state signals are input to the two input terminals of the OR gate, so that the output goes low. Consequently, since one input terminal of the NAND gate is low, whether the other input terminal is low or high, output r'1 of the NAND gate will go high.

In this way, when the RAS signal is in the set state, output r'1, which goes high due to a change in the RAS signal, is input to one input terminal of the 3-input NAND gate (WORD line controller 15), while the output signal from address decoder 13 to be input to the other input terminal is delayed in address decoder 13 and is not yet input. Consequently, the output of address decoder 13 remains low when the RAS signal is in the reset state. Consequently, the 3-input NAND gate, to which its output is connected, outputs high-state r4 regardless of the state of output r'1 from lock-out circuit 17.

By means of this signal r4, the low state of the WORD line is maintained. Consequently, the capacitor in memory cell 130 is not connected to the BIT line.

When the RAS signal returns from the set state to the reset state (HLH noise) in this state, although the RAS signal has returned to the reset state, signal s3, which indicates that the RAS signal is in the set state, is output from address decoder 13 with a prescribed delay time and is input to WORD line controller 15.

On the other hand, high-state signal r1, which indicates that the RAS signal returns to the reset state, is directly input from RAS input circuit 11 to OR gate in lock-out circuit 17. Consequently, the high-state signal is output without delay with respect to the NAND gate in the later stage.

In this case, since the two input terminals of the NAND gate are high, output r'1 goes low. In this way, even when the RAS signal in the set state returns to the reset state in a short time, change to the low state of output r'1 is carried out directly, and it is output to the 3-input NAND gate.

In this case, before input of high-state signal s3 from address decoder 13 to one input terminal of WORD line controller 15, signal r'1 input to the other input terminal is low, there is no change in the output of WORD line controller 15 (output of 3-input NAND gate), and the high-state of signal r4 is maintained.

Consequently, there is no change in the state of the WORD line to be selected, and the capacitor in memory cell 130 connected to the WORD line is not connected to the BIT line.

In this way, in order to ensure the data input/output time, the change of the RAS signal from the set state to the reset state is delayed in address decoder 13, the change in the state of the RAS signal is transmitted with a delay to WORD line controller 15. On the other hand, when the RAS signal is changed from the reset state to the set state, the change in state of the RAS signal is transmitted without a delay to WORD line controller 15 through lock-out circuit 17.

Consequently, logic calculation is performed for signal s3 output from address decoder 13 and output r'1 of lock-out circuit 17, and, only when they both are in the same state can a change in the state of the WORD line be generated. In this configuration, even when HLH noise of very short duration is superimposed on the RAS signal in the reset state, the setting operation still makes no progress in memory cell array controller 2, and there is no state in the WORD line.

<When the RAS Signal Returns to the Reset State Before it is Determined Whether the BIT Line is High or Low>

In this case, the RAS signal, which was in the set state, returns to the reset state in the period after the start of the change in the state of the selected WORD line and before it is determined whether the BIT line is high or low (period B).

Figure 5:
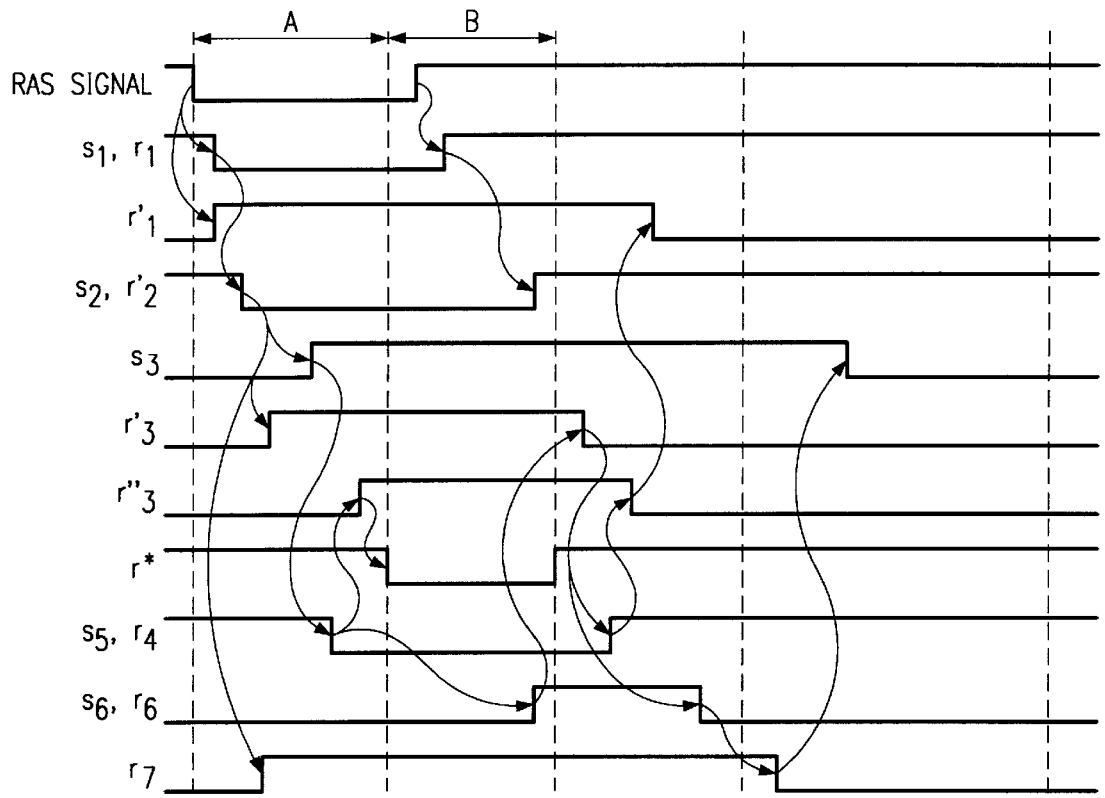
FIG. 5 is a timing diagram illustrating the case when the RAS signal in the set state returns to the reset state during period B.

As shown in FIG. 5, in period B, low-state signal s5 is output from WORD line controller 15 during period B. Said signal s5 is input to the set-side terminal (S) of the flip-flop circuit in WORD line reset circuit 18. Consequently, output r"3 of the output terminal on the set side of the flip-flop circuit goes high.

During period B, signal r6 in the low state is output from S/A controller 16, and, in WORD line reset circuit 18, it is input to the input terminal on one side of the NOR gate through the LH delay circuit.

High-state output r'3 of WORD line reset circuit 18 itself is input in inverted state through the inverter to the other input terminal of the NOR gate.

Consequently, both the signals input to the NOR gate become the low state, and a high-state signal is output from the NOR gate state.

This signal is input to the terminal of the reset side of the flip-flop circuit. In this case, output r"3 of the terminal on the set side is in the high state. Consequently, output r* on the reset side of the flip-flop circuit becomes the low state.

On the other hand, output r'2 of filter circuit 12 is low, and as output r* (in low state) on the reset side of the flip-flop circuit and output r'2 (in low state) of filter 12 are input to the NAND gate in the output stage of WORD line reset circuit 18, output r'3 of WORD line reset circuit 18 goes high.

In this case, since all of the three input terminals of WORD line controller 15 are high, signal s5 in the low state is output from WORD line controller 15. In this state, when the RAS signal returns to the reset state, output r'2 of filter 12 goes high. However, as signal r* is low, the high state of output r'3 of the NAND gate makes no change. Consequently, there is no change in the input terminal state of WORD line controller 15. Consequently, WORD line controller 15 maintains the output state of signal s5, so that the state of the WORD line is maintained.

On the other hand, after input of signal s5, S/A controller 16 outputs signal s6 after a prescribed time delay, and sense amplifier 132 functions.

After output of signal s6 to WORD line reset circuit 18 from S/A controller 16, with a prescribed time delay, the lock-out is released, the reset operation is started, and the various circuits return to the initial state. The reset operation is started after the state determination is carried out for the BIT line and writing to the memory cell is ended.

Figure 11A:
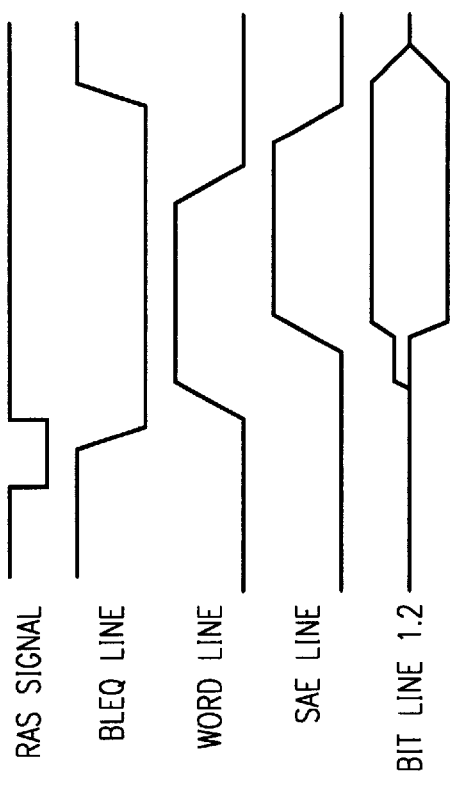
FIG. 11(a) is a timing diagram illustrating the internal operation of the memory cell array controller in the prior art when the RAS signal becomes the reset state in a short time after the start of the setting operation.
Figure 12A:
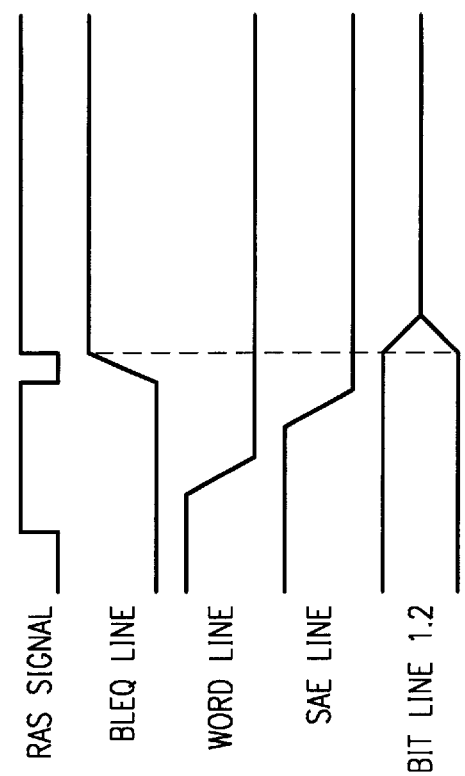
FIGS. 12(a), (b) are timing diagrams illustrating the internal operation of the memory cell array controller of this invention as compared with FIG. 11.

In this case, the timing diagram of the BLEQ line, WORD line, SEA [sic; SAE] line and BIT line is shown in FIG. 12(a). In the prior art (FIG. 11(a)), the capacitor is charged to an intermediate voltage. On the other hand, for memory cell array controller 2 of this invention, state determination of the BIT line can be performed normally, and after charging/discharging at the normal voltage, the capacitor returns to the initial state.

<When the RAS Signal Becomes the Reset State During the Reset Operation>

Figure 6:
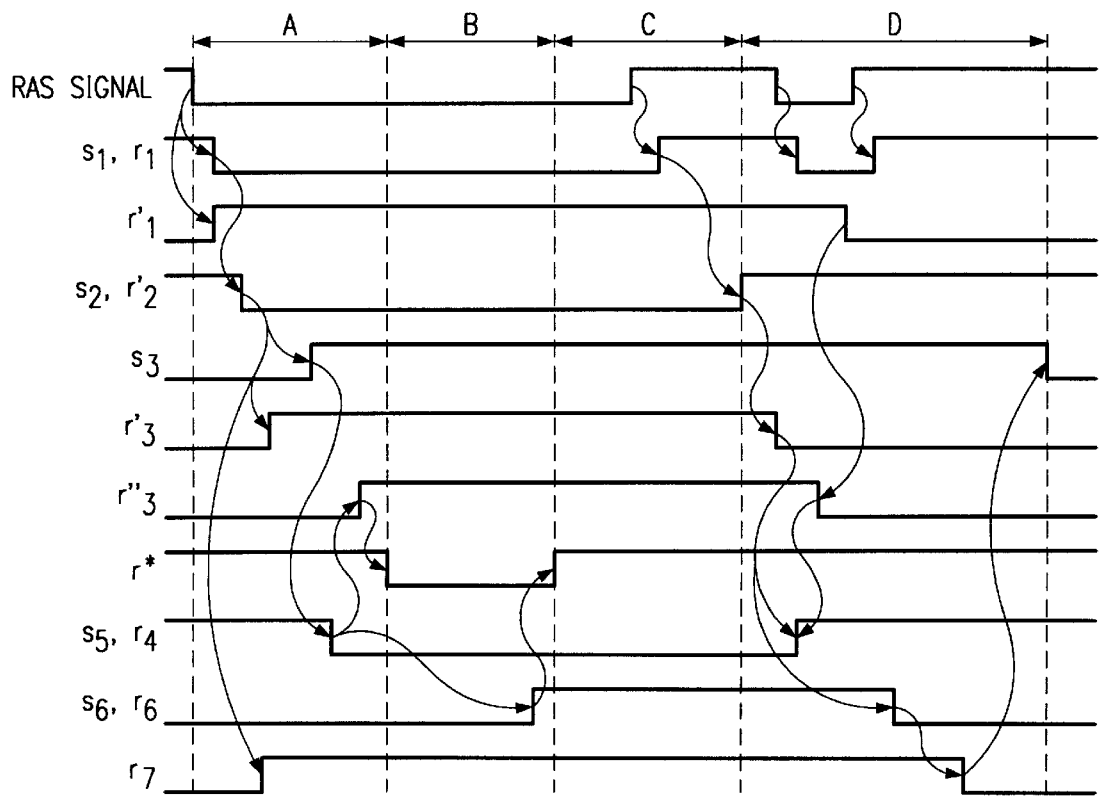
FIG. 6 is a timing diagram illustrating the case when the RAS signal in the reset state is changed to the set state during period D.

In this case, as shown in FIG. 6, a low noise (HLH noise) is superimposed only for a short time on the high-state RAS signal during the period after the start of the reset operation and release of the state change of the selected WORD line and before the BIT line is connected to the VBLR line (period D).

When the change in state of the selected WORD line is released, output r'2 of filter 12 goes high, and one end of OR gate in lock-out circuit 17 goes high.

The output of filter circuit 12 input to the other end of the OR gate changes from signal r1 (high state) to signal s1 (low state) when the RAS signal is changed from the reset state to the set state. However, since one end of the OR gate remains high, the change in the RAS signal can be neglected, and the HLH noise is not transmitted to the later stage of circuit.

Also, in filter 12, the HLH noise is removed by the flip-flop circuit, and it is not transmitted to address decoder 13.

Figure 11B:
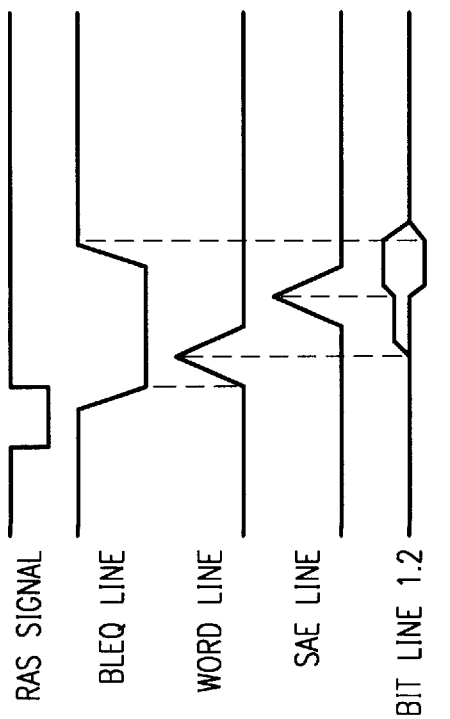
FIG. 11(b) is a timing diagram illustrating the internal operation of the memory cell array controller of the prior art when the noise indicating the set state is superimposed on the RAS signal after the start of the reset operation.
Figure 12B:
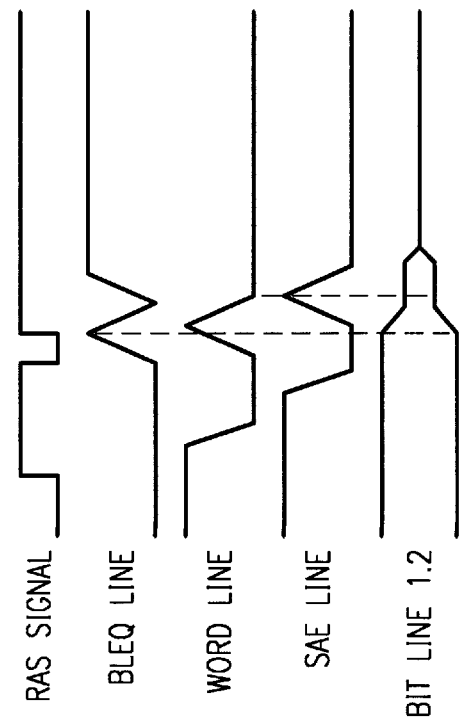

The timing diagram of the BLEQ line, WORD line, SEA line and BIT line in this case is shown in FIG. 12(b). In the prior art (FIG. 11(b)), BIT line equalizer 121 and WORD line are activated at the same time, and the capacitor is charged to an intermediate voltage. On the other hand, for memory cell controller 2 of this invention, the set state is not started, and the normal initial state is recovered.

<When LHL Noise is Superimposed During the Setting Operation>

Figure 7:
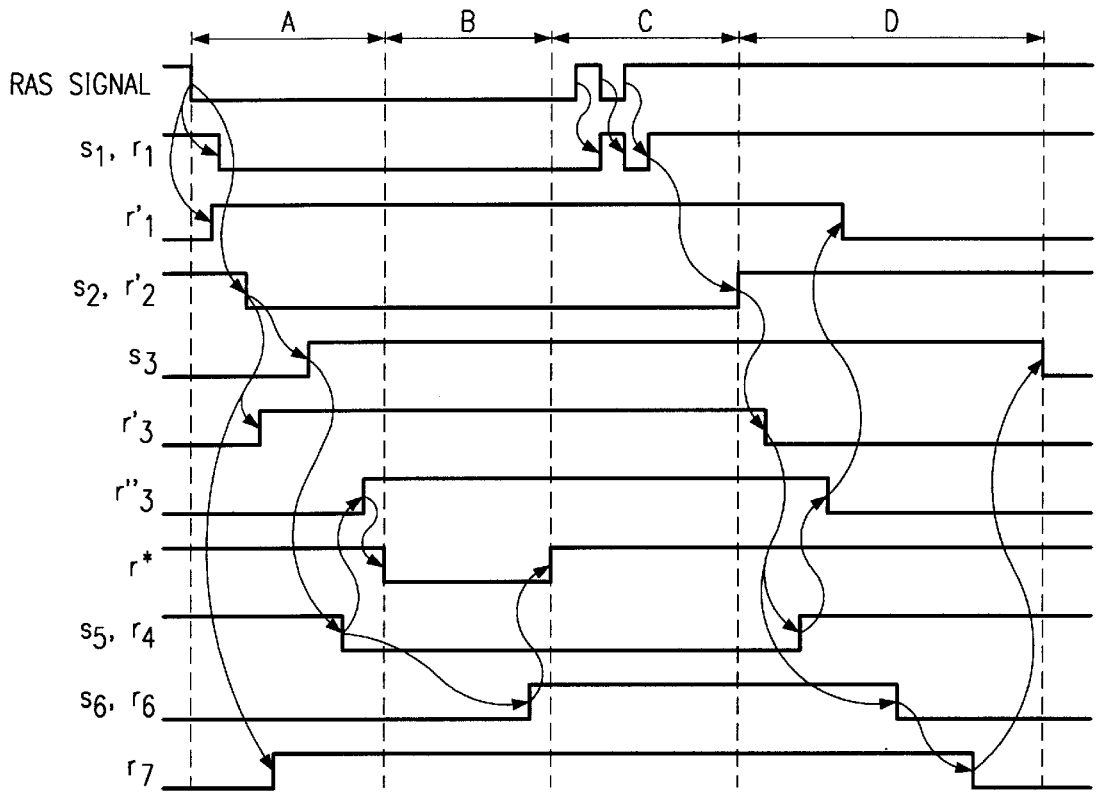
FIG. 7 is a timing diagram illustrating the case when the LHL noise is superimposed on the RAS signal in the set state.
Figure 8:
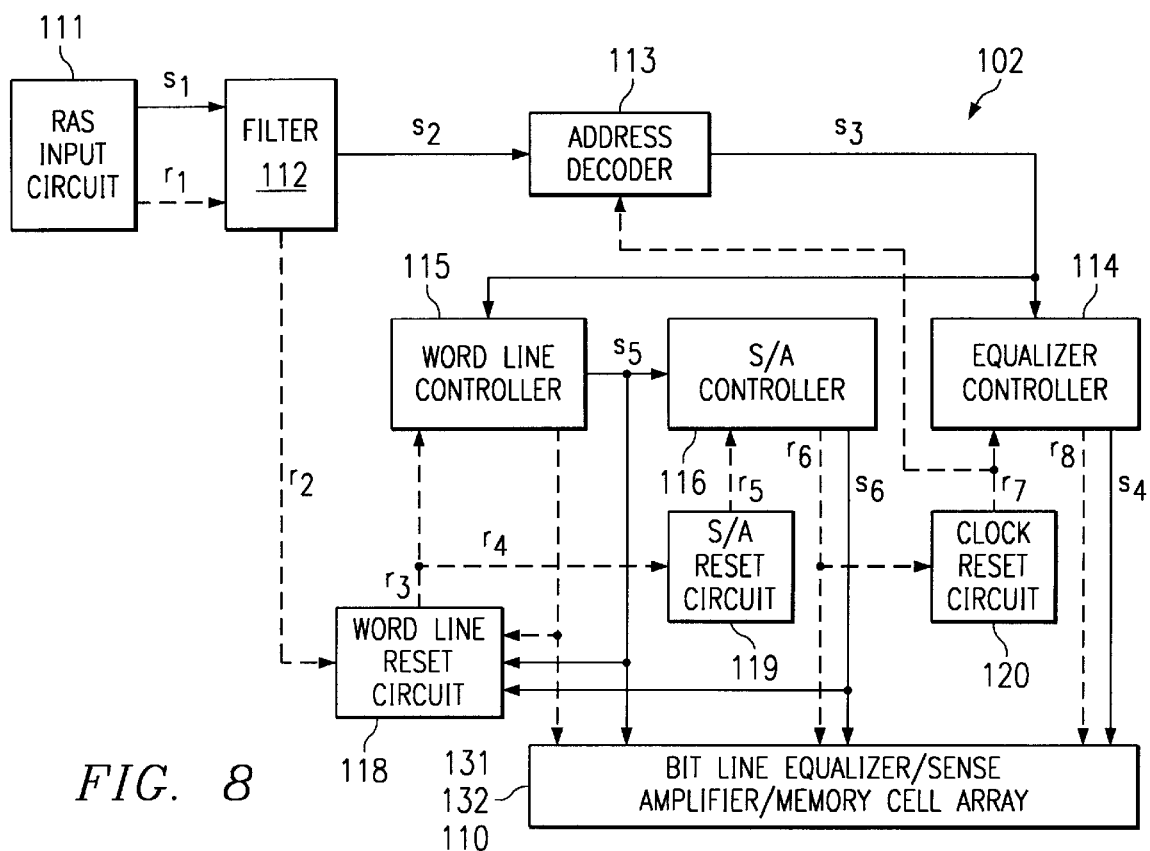
FIG. 8 is a block diagram illustrating the memory cell array controller in the prior art.
Figure 9:
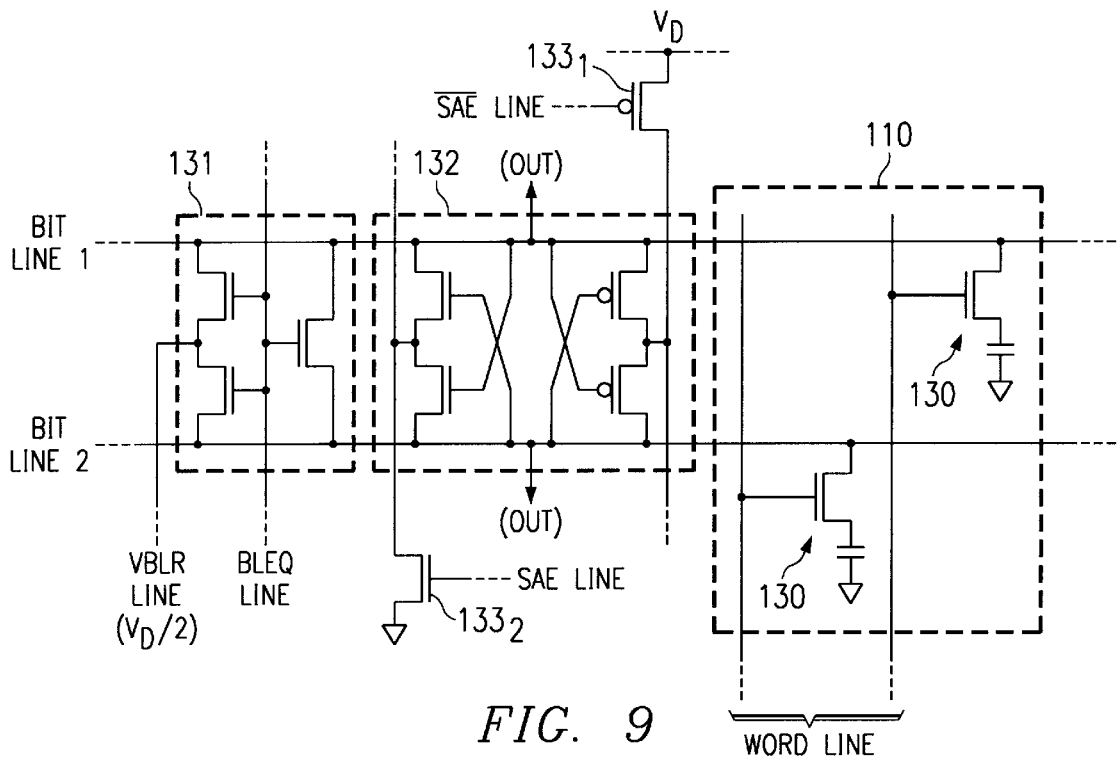
FIG. 9 is partial circuit diagram of the memory cell array.
Figure 10:
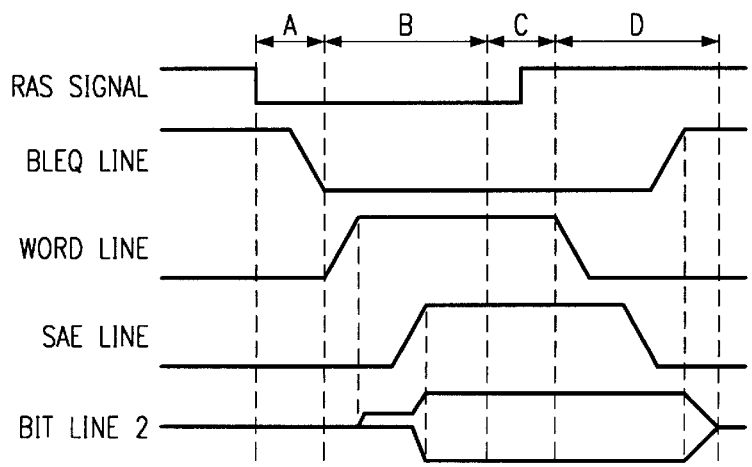
FIG. 10 is a timing diagram illustrating the operation of output of the data in the memory cell to the BIT line.

For example, as shown in FIG. 7, in this case, the high noise is superimposed immediately before the RAS signal returns to the reset state from the set state. In this case, LHL noise appears and passes through RAS input circuit 11 and is input to filter 12 and lock-out circuit 17.

In filter 12, the high noise is removed by LHL filter 21. Consequently, signal s2 output from filter (12) does not contain high noise.

On the other hand, in lock-out circuit 17, LHL noise is transmitted through OR gate to one end of the NAND gate. To the other end of the NAND gate, the low-state signal obtained by inverting output r''3 (high state) of WORD line reset circuit 18.

What is claimed is:

1. A dynamic memory comprising:

a memory cell array made of memory capacitor cells at the various intersections between plural bit line pairs and plural word lines for storing memory data in each cell;

a RAS signal input to the memory cell array having an active state and a de-active state;

a bit line equalizer which precharges the bit line pairs to a prescribed voltage;

plural sense amplifiers which amplify a minute voltage difference that appears on the bit line pairs;

a word line driving circuit which drives one word line selected from the plural word lines;

wherein upon activation of the RAS signal, signaling a memory operation, a series of setting operations are initiated, and upon deactivation of the RAS signal a series of resetting operations are initiated, and means responsive to the state of the RAS signal for stopping the setting operation when the RAS signal is reset from an active state to the de-active state before driving of the word line is commenced so that the memory cell capacitor connected to the word line is not connected to the bit line for the current memory operation.

2. The dynamic memory described in claim 1, further comprising means for neglecting the deactivation of the RAS signal so that the setting operation is continued when the RAS signal returns to the de-active state after a setting operation is initiated and before discrimination of the data of the memory cells by means of the sense amplifier.

3. The dynamic memory described in claim 1 wherein upon inactivation of the RAS signal, the resetting operation is initiated, but, before precharging of the bit line pairs in the resetting operation, the RAS signal makes a transition to the active state, the activation of the RAS signal is neglected and the resetting operation is continued despite the RAS signal transition to the active state.

4. The dynamic memory described in claim 1 wherein when noise, such that that indicates the inactivate state, is superimposed on the RAS signal in the activate state, the noise can be removed by a filter.

5. The dynamic memory described in claim 2 wherein when noise, such that that indicates the inactivate state, is superimposed when the RAS signal is in the activate state, the noise can be removed by a filter.

6. The dynamic memory described in claim 3 wherein when noise, such that that indicates the inactivate state, is superimposed when the RAS signal is in the activate state, the noise can be removed by a filter.

7. A dynamic memory comprising:

a memory cell array made of memory capacitor cells at the various intersections between plural bit line pairs and plural word lines for storing memory data in each cell;

a memory cell controller for controlling access to the memory cell array comprising:
   a RAS input circuit for receiving a RAS signal having an active state and a de-active state;

a filter circuit to filter a RAS signal from the RAS input circuit and outputs a signal to an address decoder circuit;

a word line controller circuit which receives a signal from the address decoder circuit;

a word line reset circuit having an output to the word line control circuit and an input from the filter circuit;

a lock out circuit having inputs from the RAS input circuit the filter circuit and word line reset circuit and at least an output to the word line control circuit to lock out the word line control circuit based on its inputs.

8. The dynamic memory circuit of claim 7 wherein the lock out circuit outputs the lock out signal to the word line control circuit when either the input from the RAS input circuit or the input from the filter circuit is active, and when the signal from the word line reset circuit is not active.

* * * * *